(12) United States Patent
Tsai et al.

(10) Patent No.: US 8,664,743 B1
(45) Date of Patent: Mar. 4, 2014

(54) AIR-GAP FORMATION IN INTERCONNECT STRUCTURES

(71) Applicant: Taiwan Semiconductor Manufacturing Company, Ltd., Hsin-Chu (TW)

(72) Inventors: Cheng-Hsiung Tsai, Miaoli County (TW); Chung-Ju Lee, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/665,267

(22) Filed: Oct. 31, 2012

(51) Int. Cl.
*H01L 29/00* (2006.01)
*H01L 29/80* (2006.01)
*H01L 31/112* (2006.01)

(52) U.S. Cl.
USPC ............... 257/522; 257/276; 257/E21.573

(58) Field of Classification Search
USPC ............... 257/276, 522, E21.573, E23.013
See application file for complete search history.

(56) References Cited

U.S. PATENT DOCUMENTS

| | | | | |
|---|---|---|---|---|
| 5,227,658 A * | 7/1993 | Beyer et al. | | 257/522 |
| 5,757,072 A * | 5/1998 | Gorowitz et al. | | 257/700 |
| 6,674,167 B1 * | 1/2004 | Ahn et al. | | 257/750 |
| 6,712,480 B1 * | 3/2004 | Leung et al. | | 359/846 |
| 7,211,496 B1 * | 5/2007 | Natzle | | 438/411 |
| 7,375,414 B2 * | 5/2008 | Forbes et al. | | 257/662 |
| 7,608,909 B2 * | 10/2009 | Chinthakindi et al. | | 257/522 |
| 7,863,072 B2 * | 1/2011 | Illing et al. | | 438/53 |
| 8,362,578 B2 * | 1/2013 | Wu et al. | | 257/418 |
| 8,426,931 B2 * | 4/2013 | Fujita et al. | | 257/415 |
| 8,481,400 B2 * | 7/2013 | Kautzsch et al. | | 438/411 |
| 2009/0115019 A1 * | 5/2009 | Lee et al. | | 257/522 |
| 2009/0152673 A1 * | 6/2009 | Kwon et al. | | 257/522 |

OTHER PUBLICATIONS

Pantouvaki, M., et al., "Air-gap formation by UV-assisted decomposition of CVD material," Microelectronic Engineering, vol. 85, Issue 10, Oct. 2008, pp. 2071-2074, Materials for Advanced Metallization 2008, Elservier.

* cited by examiner

*Primary Examiner* — Ida M Soward
(74) *Attorney, Agent, or Firm* — Slater & Matsil, L.L.P.

(57) ABSTRACT

A structure includes a substrate, and a first metal line and a second metal line over the substrate, with a space therebetween. A first air gap is on a sidewall of the first metal line and in the space. A second air gap is on a sidewall of the second metal line and in the space. A dielectric material is disposed in the space and between the first and the second air gaps. A third air gap is underlying the lower portion of the dielectric material, wherein the first air gap, the second air gap, and the third air gap are interconnected to form a continuous air gap.

20 Claims, 11 Drawing Sheets

AIR-GAP FORMATION IN INTERCONNECT STRUCTURES

BACKGROUND

As the semiconductor industry introduces new generations of integrated circuits (ICs) having higher performance and greater functionality, the density of the elements that form the ICs is increased, while the dimensions and spacing between components or elements of the ICs are reduced. In the past, such reductions were limited only by the ability to define the structures photo-lithographically, device geometries having smaller dimensions created new limiting factors. For example, for any two adjacent conductive features, when the distance between the conductive features decreases, the resulting capacitance (a function of the dielectric constant (k value) of the insulating material divided by the distance between the conductive features) increases. The increased capacitance results in an increased capacitive coupling between the conductors, increased power consumption, and an increase in the resistive-capacitive (RC) time constant. Therefore, the continual improvement in semiconductor IC performance and functionality is dependent upon developing materials with low k values.

Since the substance with the lowest dielectric constant is air (k=1.0), low-k dielectric materials typically comprise porous materials. Also, air-gaps are formed to further reduce the effective k value of interconnect structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An interconnect structure that comprises air gaps therein and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 1:
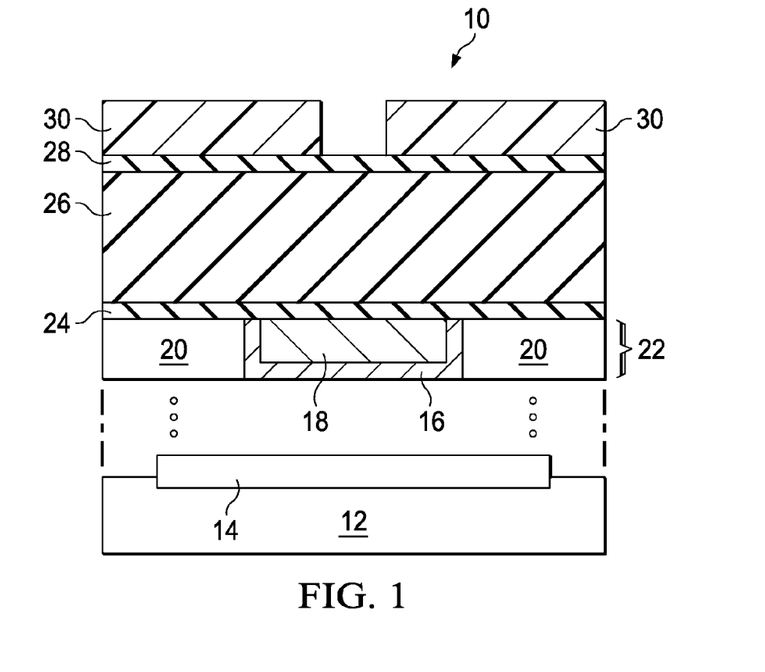
FIGS. 1 through 10 include cross-sectional views and a top view of intermediate stages in the manufacturing of an interconnect structure in accordance with some exemplary embodiments, wherein the interconnect structure includes air gaps.

FIG. 1 illustrates wafer 10, which includes semiconductor substrate 12. In some embodiments, semiconductor substrate 12 is a bulk semiconductor substrate. In alternative embodiments, semiconductor substrate 12 is a Semiconductor-On-Insulator (SOI) substrate. The semiconductor material in semiconductor substrate 12 may comprise silicon, silicon germanium, silicon carbon, a III-V compound semiconductor material, and/or the like. In some embodiments, integrated circuits 14 are formed at a top surface of semiconductor substrate 12. Integrated circuits 14 may include active devices such as transistors.

Over integrated circuit 14 is dielectric layer 20, and conductive line 22 formed in dielectric layer 20. Dielectric layer 20 may be an Inter-Layer Dielectric (ILD) layer or an Inter-Metal Dielectric (IMD) layer, and may have a low dielectric constant (k value) lower than about 2.5, for example. Conductive line 22 may include conductive barrier layer 16 and metal line 18 over barrier layer 16. In some embodiments, barrier layer 16 comprises titanium, titanium nitride, tantalum, tantalum nitride, copper manganese, alloys thereof, and/or multi-layers thereof. Metal line 18 may comprise copper, tungsten, aluminum, nickel, and/or alloys thereof. Conductive line 22 may be electrically coupled to integrated circuits 14, and may serve as the interconnection between the devices in integrated circuits 14.

Etch Stop Layer (ESL) 24 is formed over dielectric layer 20 and conductive line 22. ESL 24 may comprise a nitride, a silicon-carbon based material, a carbon-doped oxide, and/or combinations thereof. The formation methods include Plasma Enhanced Chemical Vapor Deposition (PECVD) or other methods such as High-Density Plasma CVD (HD-PCVD), Atomic Layer CVD (ALCVD), and the like. In alternative embodiments, dielectric layer 24 is a diffusion barrier layer that is used for preventing undesirable elements, such as copper, from diffusing through. In further embodiments, dielectric layer 24 acts as both an etch stop layer and a diffusion barrier layer.

FIG. 1 also illustrates the formation of low-k dielectric layer 26, which provides insulation between conductive line 22 and the overlying conductive lines that will be formed subsequently. Low-k dielectric layer 26 is sometimes referred to as an Inter-Metal Dielectric (IMD) layer. Low-k dielectric layer 26 may have a k value lower than about 3.5, or lower than about 2.5. The materials comprised in low-k dielectric layer 26 may include a carbon-containing material, organo-silicate glass, a porogen-containing material, and/or combinations thereof. Low-k dielectric layer 26 may be deposited using PECVD, although other commonly used deposition methods, such as Low Pressure CVD (LPCVD), ALCVD, and spin-on, can also be used.

Hard mask layer 28 is formed over low-k dielectric layer 26. Hard mask layer 28 may be a dielectric layer. In some embodiments, hard mask layer 28 comprises silicon nitride, silicon carbide, titanium nitride, or the like. Photo resist 30 is formed over hard mask layer 28, and is then patterned. It is appreciated that although one photo resist 30 is illustrated, in alternative embodiments, a plurality of layers may be included, which includes, and is not limited to, a bottom layer (a photo resist), a middle layer (a photo resist), an anti-reflective coating, and/or the like.

Figure 2:
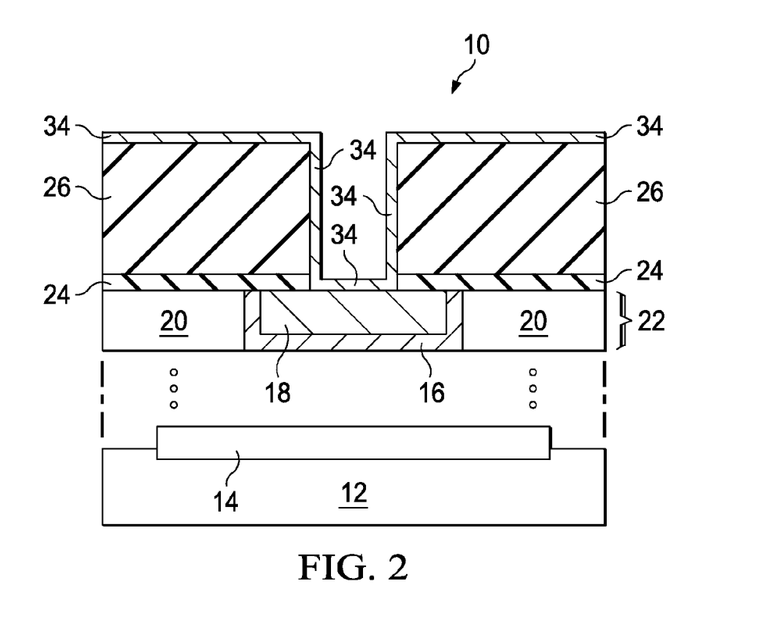

FIG. 2 illustrates the formation of via opening 32 in low-k dielectric layer 26. The formation of via opening 32 includes etching hard mask 28 (FIG. 1), and then etching low-k dielectric layer 26 using the patterned hard mask 28 as an etching mask. ESL 24 is then etched to expose the underlying conductive line 22.

Next, as also shown in FIG. 2, conductive barrier layer 34 is formed. Conductive barrier layer 34 extends into via opening 32, and includes a portion over low-k dielectric layer 26. Conductive barrier layer 34 also has a bottom portion contacting the top surface of conductive line 22. Barrier layer 34 may prevent the copper in the subsequently formed conductive material 36 (FIG. 3) from diffusing into low-k dielectric layer 26. In some embodiments, conductive barrier layer 34 is formed of a conductive material comprising titanium, titanium nitride, tantalum, tantalum nitride, copper manganese, alloys thereof, or multi-layers thereof.

Figure 3:
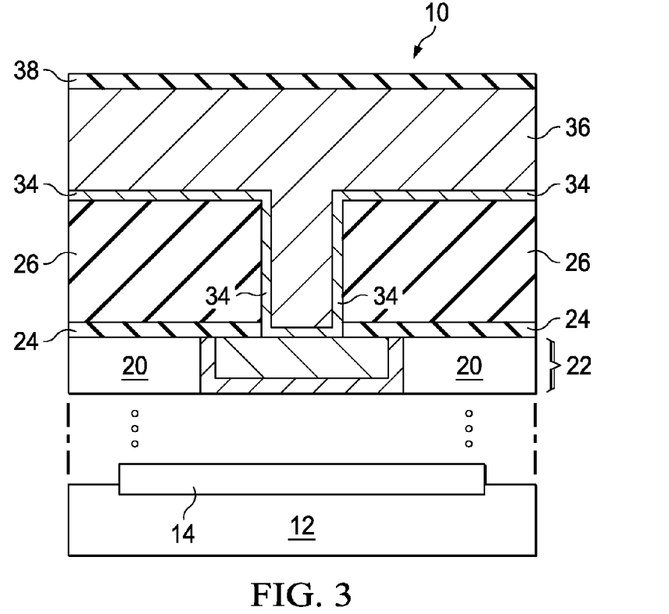

Referring to FIG. 3, conductive material 36 is formed. In some embodiments, conductive material 36 comprises copper, and may be formed of either substantially pure copper or a copper compound. Conductive material 36 is hence accordingly referred to as a copper-comprising material, although conductive material 36 may also be a non-copper material comprising aluminum, tungsten, and/or the like. The top surface of conductive material 36 is higher than the top surface of conductive barrier layer 34. The formation of copper-comprising material 36 may include plating, Metal Organic Chemical Vapor Deposition (MOCVD), or the like. A planarization may be performed to flatten the top surface of copper-comprising material 36. Next, hard mask 38, which may be formed of a material selected from the same group of candidate materials of hard mask 28, is formed over copper-comprising material 36.

Figure 4:
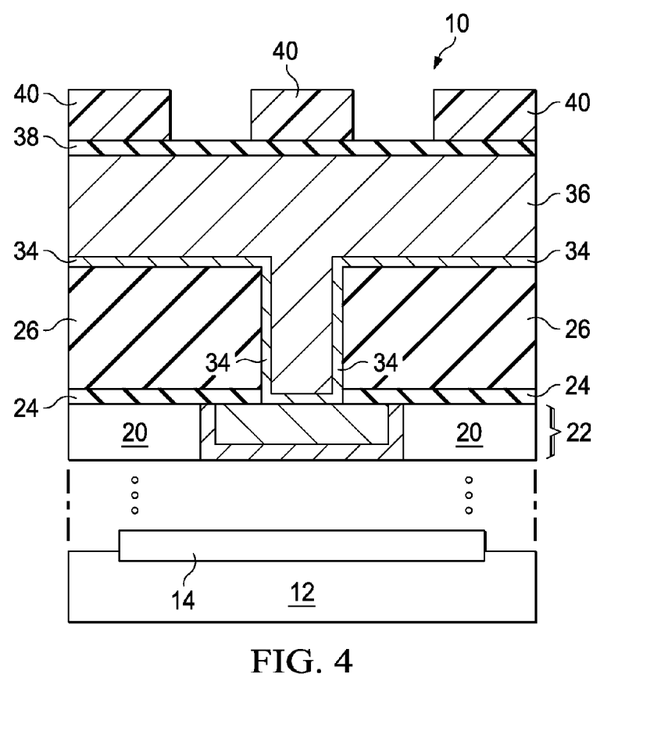
Figure 5:
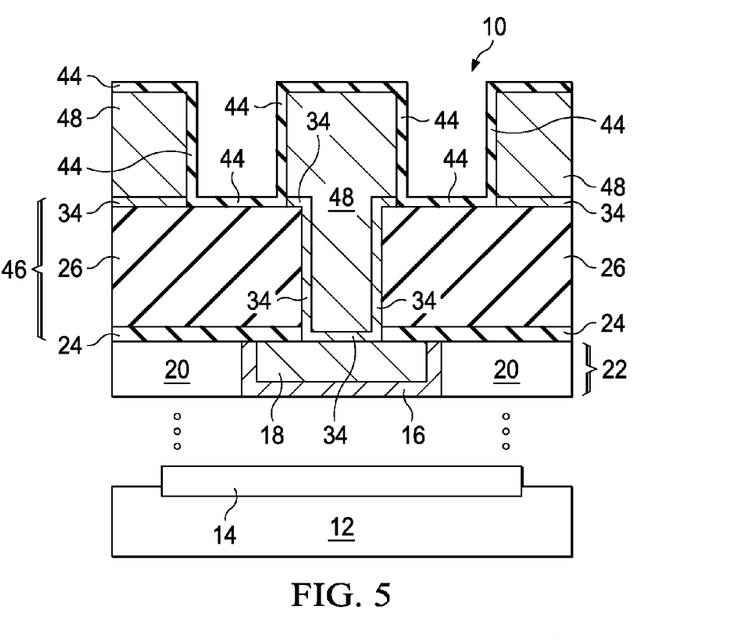

FIG. 4 illustrates the formation and the patterning of photo resist 40. Similar to photo resist 30 in FIG. 1, the illustrated photo resist 40 may represent a plurality of layers including, and not limited to, a bottom layer, a middle layer, an anti-reflective coating, and/or the like. Next, the pattern of photo resist 40 is transferred to the underlying hard mask 38, and then to copper-comprising material 36. Some portions of conductive barrier layer 34 are then exposed. The exposed portions of conductive barrier layer 34 are also removed, and some portions of the underlying low-k dielectric layer 26 are exposed. Photo resist 40 and hard mask 38 are then removed. The resulting structure is shown in FIG. 5. The patterning of copper-comprising material 36 and conductive barrier layer 34 may be performed by etching. Dielectric barrier layer 44 is then formed, for example, by deposition. Dielectric barrier layer 44 may be formed of silicon nitride, silicon carbide, silicon oxynitride, or multi-layers thereof. After the patterning of copper-comprising material 36, a portion of copper-comprising material 36 in low-k dielectric layer 26 forms via 46 along with the contacting portions of conductive barrier layer 34. The portions of copper-comprising material 36 over low-k dielectric layer 26 forms metal lines 48.

Figure 6:
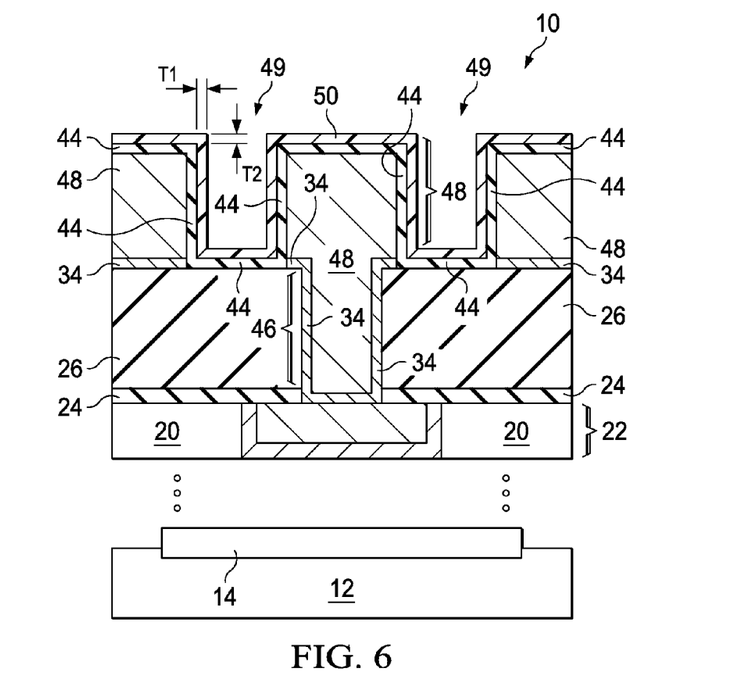

Referring to FIG. 6, decomposable layer 50 is formed over metal lines 48, and in the spaces 49 (also referred to as openings 49) between metal lines 48. In some embodiments, decomposable layer 50 includes a polymer that may decompose and vaporize when exposed to Ultra-Violet light and/or heated to an elevated temperature, for example, between 250° C. and 500° C. Exemplary materials of decomposable layer 50 include P(neopentul methacrylate-co-ethylene glycol dimethacrylate) copolymer, polypropylene glycol (PPG), polybutadine (PB), polyethylene glycol (PEG), polycaprolactone diol (PCL), fluorinated amorphous carbon (a-FiC), silicon gel and/or organic silaxone. Decomposable layer 50 may be formed by spin coating or a deposition process such as a Chemical Vapor Deposition (CVD) process, for example.

Decomposable layer 50 may be formed as a conformal layer, wherein thickness T1 of the vertical portions of decomposable layer 50 is close to thickness T2 of the horizontal portions of decomposable layer 50. Ratio T1/T2 may also be between about 0.7 and about 1, between about 0.8 and about 1, or between about 0.9 and about 1. Thicknesses T1 and T2 may be between about 5 nm and about 20 nm in some exemplary embodiments. It is appreciated, however, that the values recited throughout the description are merely examples, and may be changed to different values.

Figure 7:
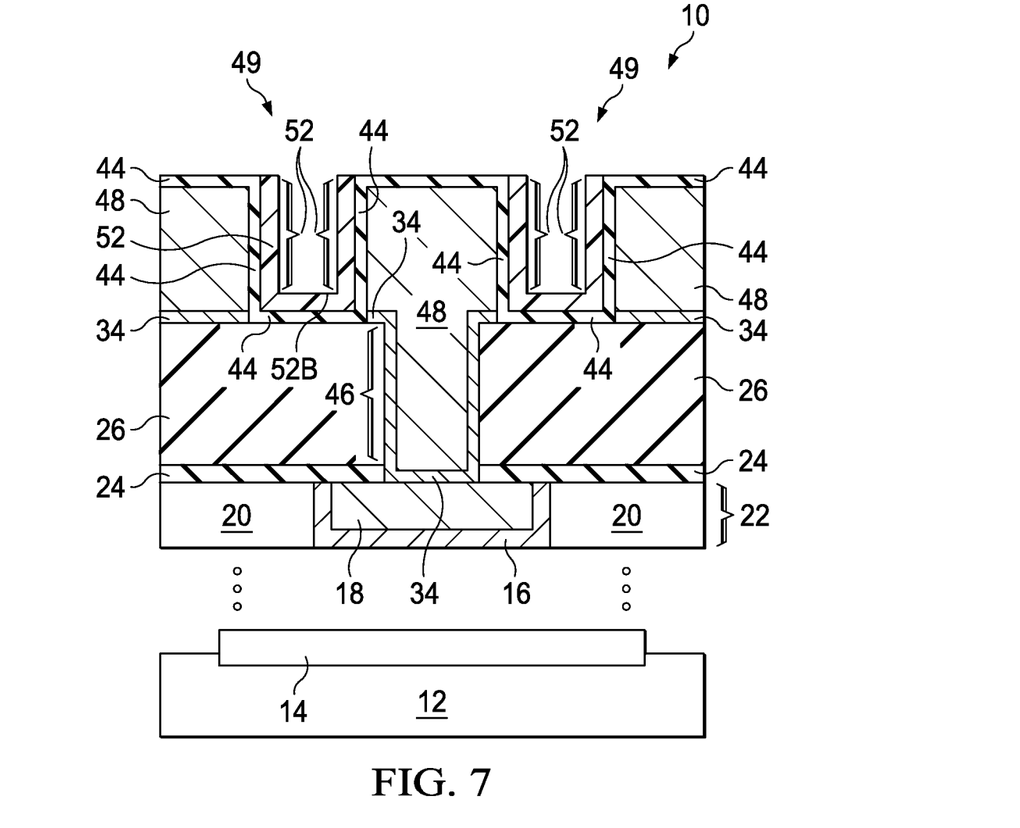

Referring to FIG. 7, a planarization (such a Chemical Mechanical Polish (CMP)) is performed to remove the portions of decomposable layer 50 over metal lines 48 and dielectric barrier layer 44. In some embodiments, dielectric barrier layer 44 is used as a CMP stop layer in the CMP process. The portions of decomposable layer 50 in openings 49 are left un-removed, and are referred to as decomposable portions 52 hereinafter. Decomposable portions 52 include sidewall portions 52A (also referred to as vertical portions hereinafter) that are on the sidewalls of openings 49, and bottom portions 52B (also referred to as horizontal portions hereinafter) that are at the bottoms of openings 49. As a result of the CMP, the top surfaces of sidewall portions 52A are substantially level with or slightly lower than the top surfaces of dielectric barrier layer 44.

Figure 8:
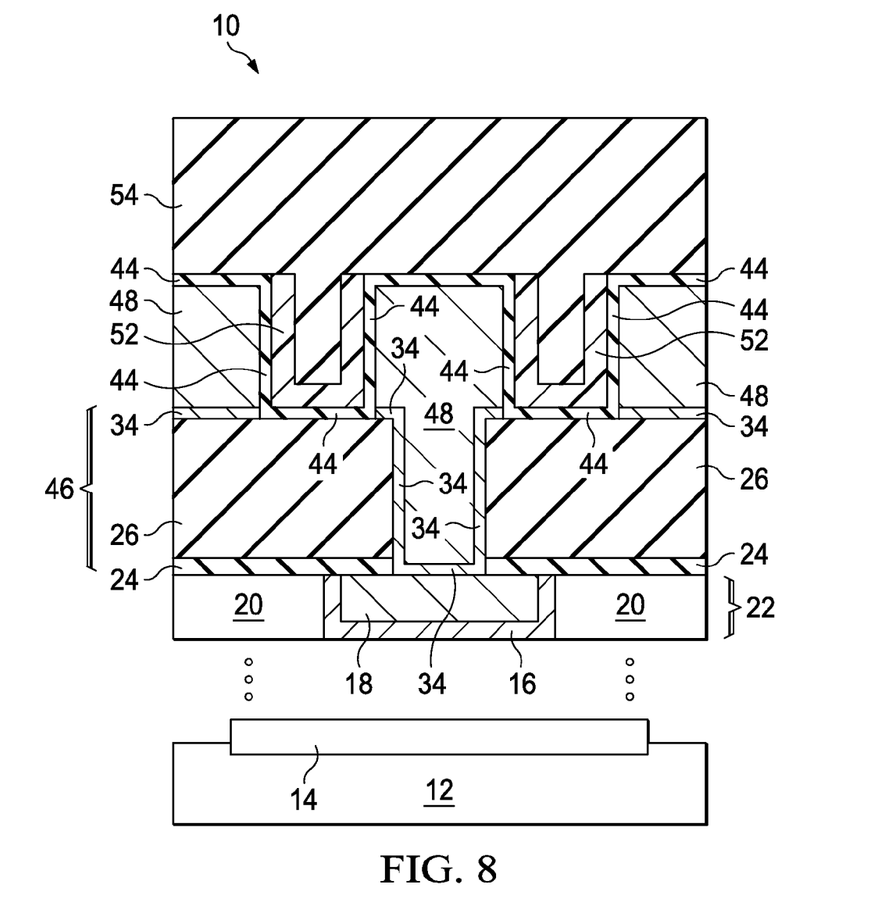

Next, in FIG. 8, low-k dielectric material 54 is formed. Low-k dielectric material 54 may have a k value lower than about 3.0, or lower than about 2.5, and may be formed of carbon-containing low-k dielectric materials, for example. Low-k dielectric material 54 is porous. Openings 49 (FIG. 7) between metal lines 48 are filled with low-k dielectric material 54. Furthermore, low-k dielectric material 54 may include an upper portion over and contacting some horizontal portions of dielectric barrier layer 44, which horizontal portions overlap metal lines 48. The lower portions and the upper portions of low-k dielectric material 54 may be formed in a same formation process, and hence there is no visible interface therebetween.

Figure 9A:
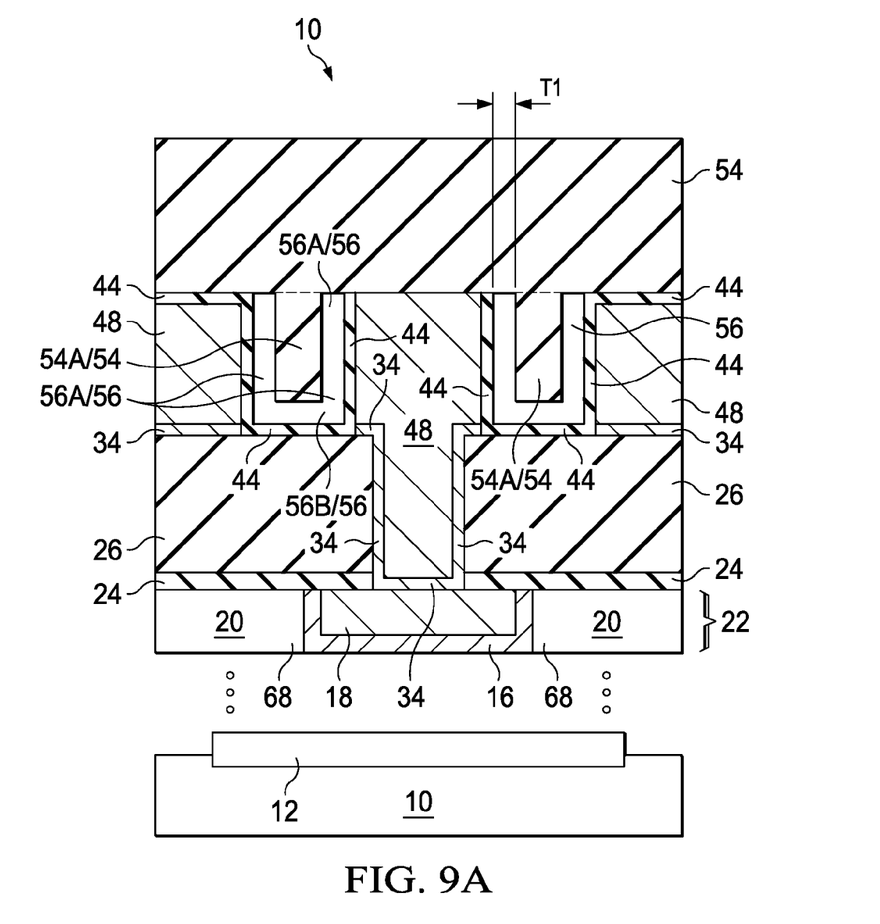

As shown in FIG. 9A, decomposable portions 52 in FIG. 8 are decomposed and turned into a vapor with molecules small enough to diffuse through the pores of low-k dielectric material 54. Air-gaps 56 are thus formed. The decomposition and vaporization may be performed through an UV exposure and/or a heating process at an elevated temperature. In some exemplary embodiments, decomposable portions 52 include P(neopentul methacrylate-co-ethylene glycol dimethacrylate) copolymer. The vaporization may thus be performed with a UV exposure, and the corresponding heating temperature may be between about 250° C. and about 500° C.

As a result of the vaporization, air gaps 56 are formed. Air gaps 56 may have essentially the same shape and size as that of decomposable portions 52 in FIG. 8. Air gaps 56 also include sidewall portions 56A and bottom portions 56B. Sidewall portions 56A may have a substantially uniform thickness T1 in some embodiments. Low-k dielectric material 54 comprises portions 54A between air gaps 56. Portions 54A of low-k dielectric material 54 also have edges and bottom surfaces exposed to air gaps 56. Furthermore, some vertical portions of conductive barrier layer 34 may be exposed to air gaps 56. The top ends of air gaps 56 may be substantially level with or slightly lower than the stop surfaces of dielectric barrier layer 44.

Figure 9B:
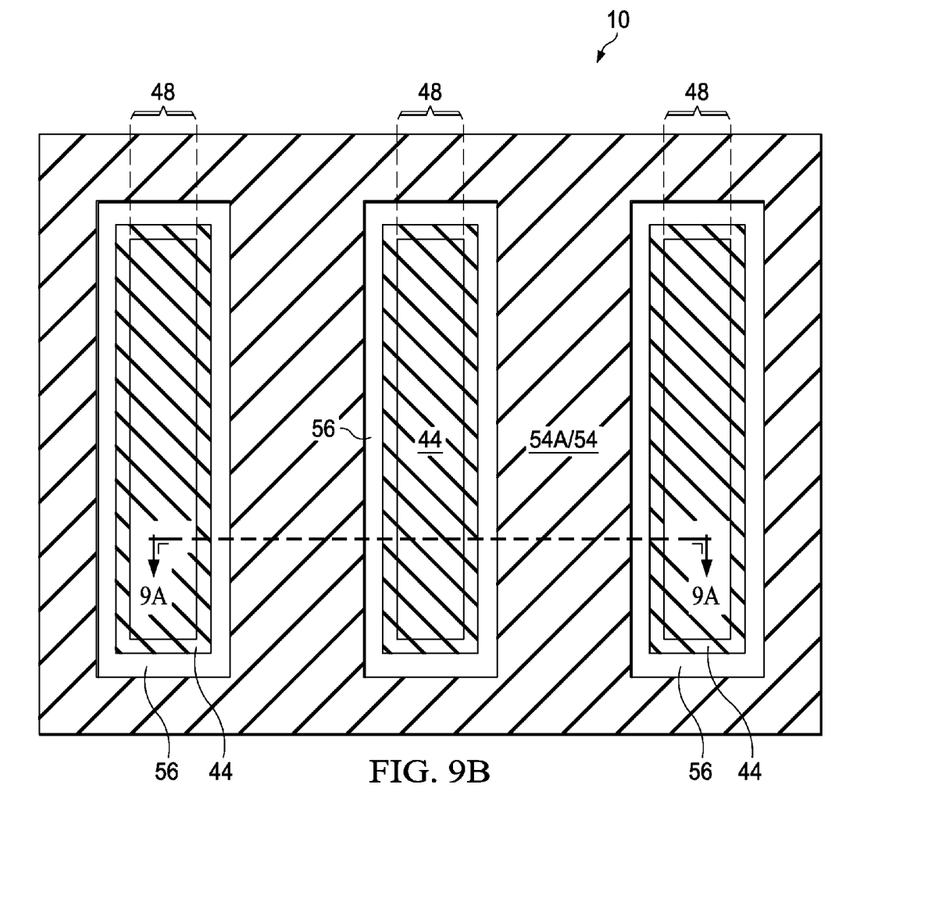

FIG. 9B illustrates a top view of the structure in FIG. 9A, wherein the cros s-sectional view in FIG. 9A is obtained from the plane crossing line 9A-9A in FIG. 9B. It is shown that sidewall portion 56A of each of air gaps 56 may form a continuous air gap ring encircling one of metal lines 48 and dielectric barrier layer 44. In the top-view, low-k dielectric material portions 54A may further encircle air gap rings 56.

Figure 10:
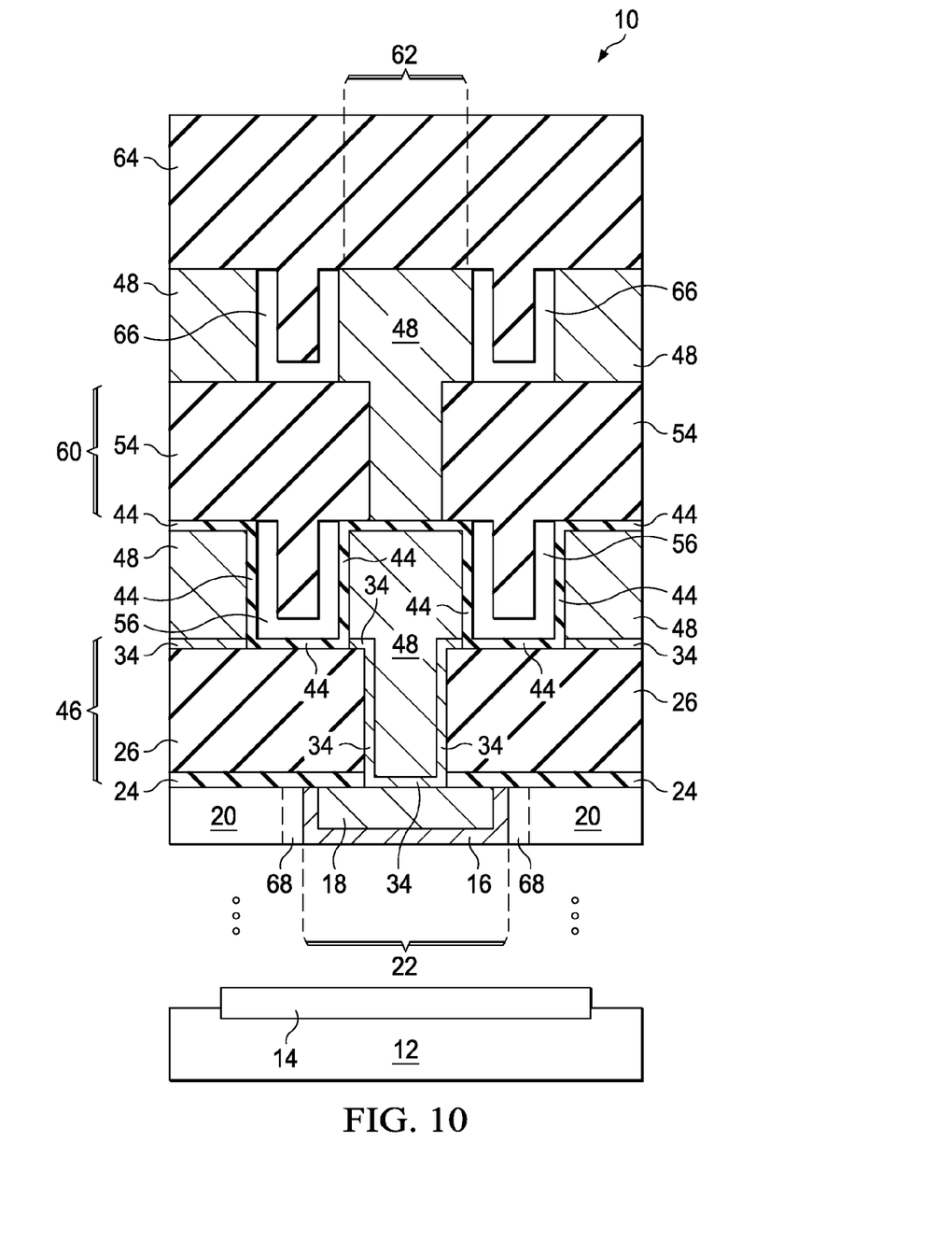

FIG. 10 illustrates additional via 60 over metal lines 48 and in low-k dielectric material 54, and metal lines 62 over via 60 and in low-k dielectric material 64. Via 60 is electrically coupled to the respective underlying metal line 48. Air gaps 66 may be formed on the sidewalls of, and encircle, metal lines 62. The formation processes may be essentially the same as in FIGS. 2 through 9A, and are not repeated herein.

In the previously discussed embodiments, the metal lines and the underlying vias are formed simultaneously. Similar process and materials as discussed in the embodiments can also be adopted in the formation of metal lines that do not have underlying connecting vias. For example, as shown in FIG. 10, air gaps 68 may also be formed to encircle conductive line 22, wherein no via that is formed in the same process as conductive line 22 is located underlying and connected to conductive line 22. The formation process may be realized through the teaching of the embodiments.

Figure 11:
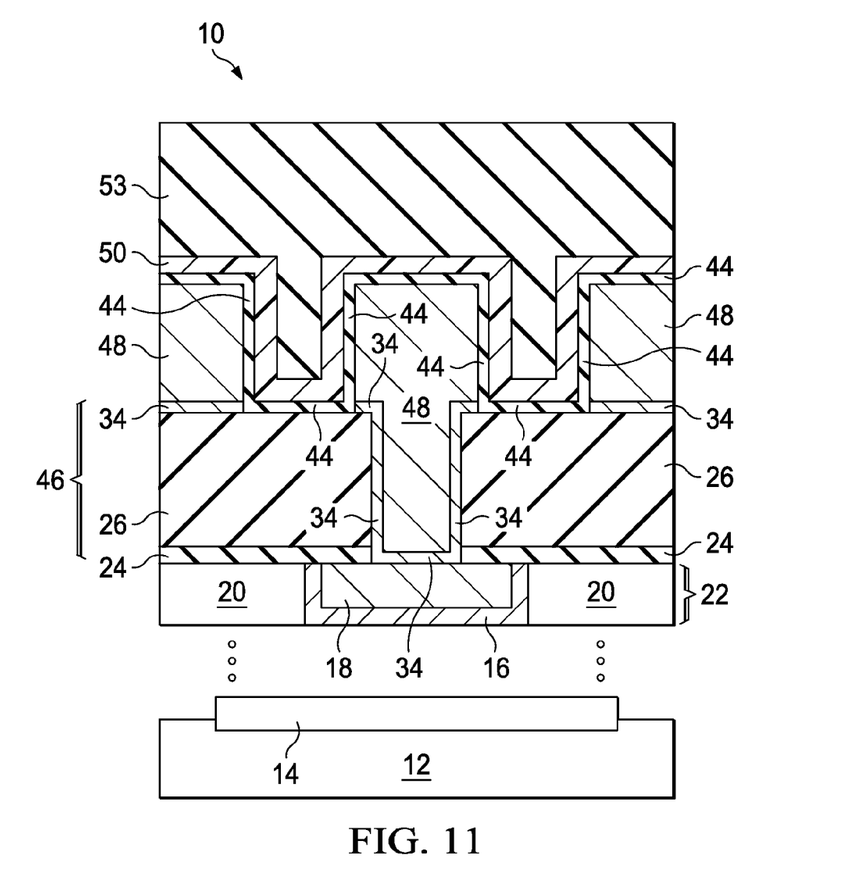
FIG. 11 through 13 include cross-sectional views of intermediate stages in the manufacturing of an interconnect structure in accordance with some alternative embodiments.
Figure 12:
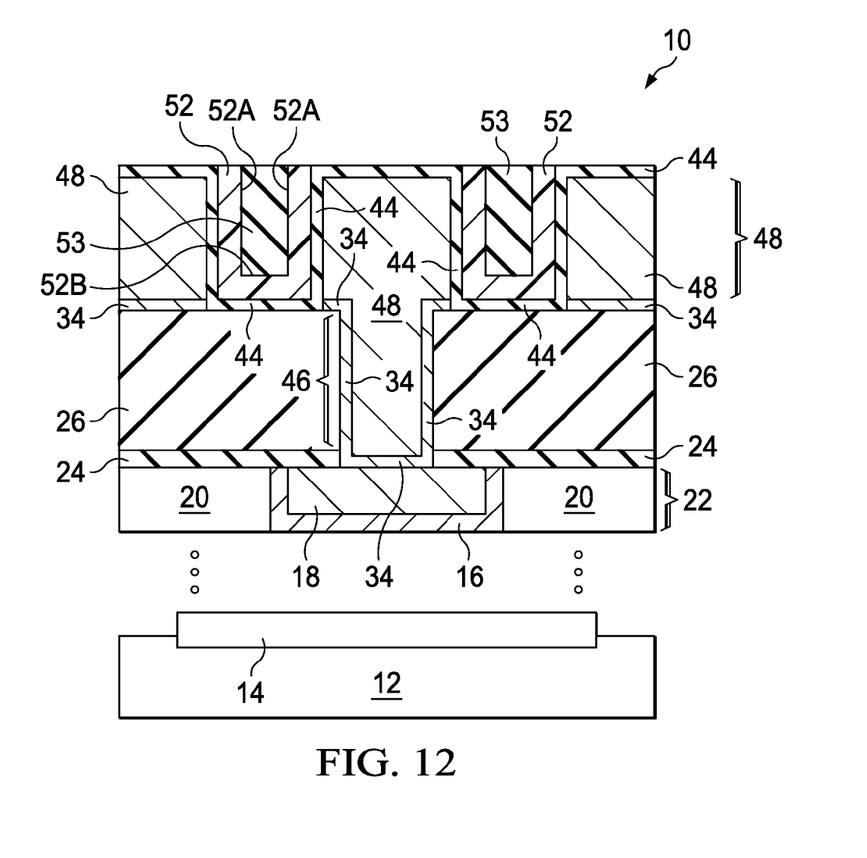
Figure 13:
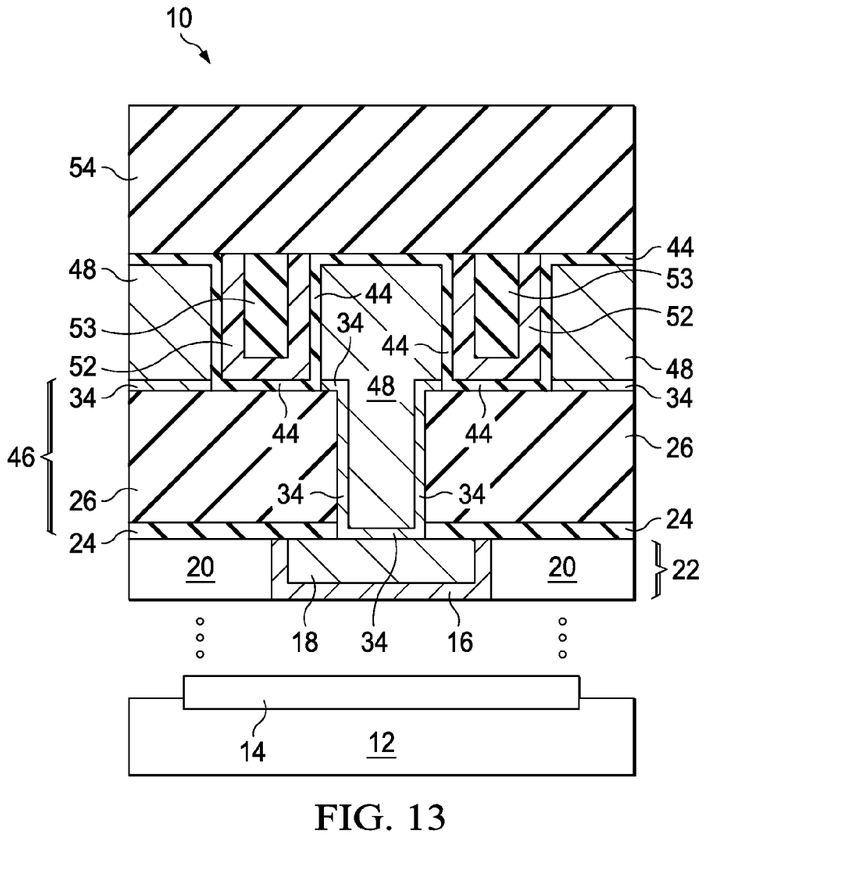

FIGS. 11 through 13 illustrate cross-sectional views of intermediate stages in the formation of air gaps in interconnect structures in accordance with alternative embodiments. Unless specified otherwise, the materials and formation methods of the components in these embodiments are essentially the same as the like components, which are denoted by like reference numerals in the embodiments shown in FIGS. 1 through 10. The details regarding the formation process and the materials of the components shown in FIGS. 11 through 13 may thus be found in the discussion of the embodiments shown in FIGS. 1 through 10.

The initial steps of these embodiments are essentially the same as shown in FIGS. 1 through 6. Next, as shown in FIG. 11, low-k dielectric layer 53 is filled into openings 49 (FIG. 6), with a portion of low-k dielectric layer 53 over metal lines 48. Low-k dielectric layer 53 may be formed of a material that is selected from the same group of candidate materials of low-k dielectric material 54 (FIG. 8), which material may be porous.

Referring to FIG. 12, a CMP is then performed to remove the portions of low-k dielectric material 53 and decomposable layer 50 over dielectric barrier layer 44. In the CMP, dielectric barrier layer 44 may be used as a CMP stop layer. As a result, the remaining portions of low-k dielectric material 53 and decomposable layer 50 have top surfaces substantially level with each other. The remaining portions of decomposable layer 50 are referred to as decomposable portions 52 hereinafter, which have shapes and sizes similar to that in FIG. 7. Similarly, decomposable portions 52 include sidewall portions 52A and bottom portions 52B.

Referring to FIG. 13, low-k dielectric material 54 is formed over low-k dielectric material 53, metal lines 48, and dielectric barrier layer 44. Low-k dielectric materials 53 and 54 may be formed of different dielectric materials. Alternatively, low-k dielectric materials 53 and 54 are formed of a same material. In these embodiments, since low-k dielectric materials 53 and 54 are formed in different processes, a visible interface between low-k dielectric materials 53 and 54 may be observed regardless of whether low-k dielectric materials 53 and 54 are formed of a same material or different materials. The subsequent process steps are essentially the same as in FIGS. 9A and 10, and are not repeated herein.

In the embodiments, air gaps are formed in the interconnect structures. Since air gaps have a k value equal to 1, the equivalent k value of the dielectric material in the interconnect structures is lowered, resulting in a reduction in the parasitic capacitance between metal lines 48 (FIG. 10). The formation of the air gaps is uniform and controllable, and does not suffer from the permeable (porous) hard mask collapsing problem that may occur in conventional methods for forming the air gaps.

In accordance with embodiments, a structure includes a substrate, and a first metal line and a second metal line over the substrate, with a space therebetween. A first air gap is on a sidewall of the first metal line and in the space. A second air gap is on a sidewall of the second metal line and in the space. A dielectric material is disposed in the space and between the first and the second air gaps. A third air gap is underlying the lower portion of the dielectric material, wherein the first air gap, the second air gap, and the third air gap are interconnected to form a continuous air gap.

In accordance with other embodiments, a structure includes a substrate, a copper-containing line over the substrate, and a dielectric barrier layer, which includes a top portion over and contacting the first copper-containing line, and an edge portion contacting a sidewall of the first copper-containing line. The structure further includes a low-k dielectric region having a lower portion, and an air gap including a first portion and a second portion. The first portion encircles the first copper-containing line and an edge portion of the dielectric barrier layer. The edge portion of the dielectric barrier layer is exposed to the first portion of the air gap. The second portion of the air gap is underlying the lower portion of the low-k dielectric region. The first portion and the second portion of the air gap are interconnected with each other to form an integrated air gap.

In accordance with yet other embodiments, a method includes forming an opening in a conductive region, and forming a decomposable layer. The decomposable layer includes a top portion over the conductive region, a sidewall portion in the opening and adjacent to a sidewall of the conductive region, and a bottom portion at a bottom of the opening. The method further includes performing a planarization step on the decomposable layer to remove the top portion of the decomposable layer, forming a low-k dielectric layer in a remaining portion of the opening, and decomposing the sidewall portion of the decomposable layer to form an air gap.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A structure comprising:
   a substrate;
   a first metal line and a second metal line over the substrate, with a space therebetween;
   a first air gap adjacent to a sidewall of the first metal line and in the space;
   a second air gap adjacent to a sidewall of the second metal line and in the space;
   a dielectric material comprising a lower portion in the space and between the first and the second air gaps; and
   a third air gap underlying the lower portion of the dielectric material, wherein the first air gap, the second air gap, and the third air gap are interconnected to form a continuous air gap.

2. The structure of claim 1, wherein the first air gap forms a continuous air gap ring encircling the first metal line.

3. The structure of claim 1, wherein the first metal line comprises a copper-containing feature, and wherein the structure further comprises a dielectric barrier layer comprising an edge portion contacting a sidewall of the copper-containing feature, and a top portion contacting a top surface of the copper-containing feature.

4. The structure of claim 3, wherein the dielectric barrier layer further comprises a bottom portion extending underlying the first, the second, and the third air gaps.

5. The structure of claim 1, wherein the dielectric material further comprises an upper portion overlying the lower portion and the first and the second metal lines, wherein the lower portion and the upper portion are formed of a same material, and wherein no visible interface is located between the lower portion and the upper portion of the dielectric material.

6. The structure of claim 1, wherein the dielectric material further comprises an upper portion overlying the lower portion and the first and the second metal lines, wherein the lower portion and the upper portion are formed of different materials.

7. The structure of claim 1, wherein the first air gap is substantially conformal, with lower portions and upper portions of the first air gap having substantially a same thickness.

8. A structure comprising:
a substrate;
a first copper-containing line over the substrate;
a dielectric barrier layer comprising a top portion over and contacting the first copper-containing line, and an edge portion contacting a sidewall of the first copper-containing line;
a low-k dielectric region comprising a lower portion; and
a first air gap comprising:
a first portion encircling the first copper-containing line and an edge portion of the dielectric barrier layer, wherein the edge portion of the dielectric barrier layer is exposed to the first portion of the first air gap; and
a second portion underlying the lower portion of the low-k dielectric region, wherein the first portion and the second portion of the first air gap are interconnected with each other to form the first air gap as a continuous air gap.

9. The structure of claim 8, wherein the low-k dielectric region further comprises an upper portion continuously connected to the lower portion, with no visible interface between the upper portion and the lower portion, and wherein the upper portion of the low-k dielectric region is overlying the first copper-containing line.

10. The structure of claim 9, wherein the upper portion of the low-k dielectric region comprises a bottom surface contacting the top portion of the dielectric barrier layer.

11. The structure of claim 8, wherein the low-k dielectric region further comprises an upper portion with a visible interface between the upper portion and the lower portion, and wherein the upper portion of the low-k dielectric region is overlying the first copper-containing line.

12. The structure of claim 8, wherein a top end of the first air gap is level with or lower than a top surface of the top portion of the dielectric barrier layer, and wherein the dielectric barrier layer further comprises a bottom portion underlying and exposed to the second portion of the first air gap.

13. The structure of claim 12, wherein the bottom portion of the dielectric barrier layer is further overlying and contacting an underlying dielectric region.

14. The structure of claim 8 further comprising:
a second copper-containing line over the substrate and level with the first copper-containing line, wherein the dielectric barrier layer further comprises an additional top portion over and contacting the second copper-containing line, and an additional edge portion contacting a sidewall of the second copper-containing line; and
a second air gap encircling the second copper-containing line, wherein the additional edge portion of the dielectric barrier layer is exposed to the second air gap, wherein an additional sidewall of the lower portion of the low-k dielectric region is further exposed to the second air gap, and wherein the first air gap and the second air gap are interconnected.

15. A structure comprising:
a semiconductor substrate;
a first metal line and a second metal line over the semiconductor substrate;
a conformal air gap between the first metal line and the second metal line, wherein the conformal air gap comprises:
a first vertical portion and a second vertical portion comprising top ends substantially coplanar with top surfaces of the first metal line and the second metal line; and
a horizontal portion connected to bottom ends of the first vertical portion and the second vertical portion, wherein the first vertical portion, the second vertical portion, and the horizontal portion have substantially a same thickness; and
a dielectric material between the first vertical portion and the second vertical portion of the conformal air gap, wherein the dielectric material is exposed to the first vertical portion, the second vertical portion, and the horizontal portion of the conformal air gap.

16. The structure of claim 15, wherein the conformal air gap comprises an air gap ring encircling the first metal line.

17. The structure of claim 15, wherein the first metal line comprises a copper-containing feature, wherein the structure further comprises a dielectric barrier layer comprising an edge portion contacting a sidewall of the copper-containing feature, and wherein the edge portion is exposed to the first vertical portion of the conformal air gap.

18. The structure of claim 17, wherein the dielectric barrier layer further comprises a top portion contacting a top surface of the copper-containing feature, wherein the top portion is continuously connected to the edge portion.

19. The structure of claim 17, wherein the dielectric barrier layer further comprises a bottom portion extending underlying the horizontal portion of the conformal air gap.

20. The structure of claim 15 further comprising a conductive barrier layer underlying and in contact with the first metal line, wherein the conductive barrier layer does not extend on sidewalls of the first metal line.

* * * * *